United States Patent [19]
Ghezzi et al.

[11] Patent Number: 5,553,017
[45] Date of Patent: Sep. 3, 1996

[54] ELECTRICALLY ERASABLE AND PROGRAMMABLE READ-ONLY MEMORY CELLS WITH A SINGLE POLYSILICON LEVEL AND METHOD FOR PRODUCING THE SAME

[75] Inventors: Paolo Ghezzi, Rivolta D'Adda; Federico Pio, Milan; Carlo Riva, Monza, all of Italy

[73] Assignee: SGS-Thomson Microelectronics S.r.l., Agrate Brianza, Italy

[21] Appl. No.: 310,836

[22] Filed: Sep. 22, 1994

Related U.S. Application Data

[62] Division of Ser. No. 983,799, Nov. 24, 1992, Pat. No. 5,367,483.

[30] Foreign Application Priority Data

Nov. 29, 1991 [IT] Italy .................. MI91A3196

[51] Int. Cl.⁶ .................................................. G11C 11/34
[52] U.S. Cl. .................. 365/185.01; 257/314; 257/324
[58] Field of Search ........................... 365/185; 437/43, 437/52; 257/314, 324

[56] References Cited

U.S. PATENT DOCUMENTS 4,047,974  9/1977  Harari ........................ 257/324
5,254,489 10/1993  Nakata ........................ 437/43
5,355,332 10/1994  Endoh et al. ................ 365/185

FOREIGN PATENT DOCUMENTS 0244367 11/1987  European Pat. Off. .
0268315  5/1988  European Pat. Off. .
3107543 12/1981  Japan .

OTHER PUBLICATIONS

Patent Abstracts of Japan, vol. 6, No. 259 (E-149)(1137) Dec. 17, 1982 & JP-A-57155769 (Fujistu K.K.) Sep. 25, 1982.

Patent Abstracts of Japan, vol. 12, No. 403 (e-674)(3250) Oct. 26, 1988 & JP-A-63144559 (Toshiba Corp) Jun. 16, 1988.

*Primary Examiner*—David C. Nelms
*Assistant Examiner*—F. Niranjan
*Attorney, Agent, or Firm*—David M. Driscoll; James H. Morris; Brett N. Dorny

[57] ABSTRACT

A method for producing electrically erasable and programmable read-only memory cells with a single polysilicon level, including the use of a sacrificial layer of silicon oxide to produce a high-thickness silicon oxide layer on the active area. The active area of the cell is protected from heavy source and drain implantation in order to improve reliability.

3 Claims, 2 Drawing Sheets

5,553,017

ELECTRICALLY ERASABLE AND PROGRAMMABLE READ-ONLY MEMORY CELLS WITH A SINGLE POLYSILICON LEVEL AND METHOD FOR PRODUCING THE SAME

This application is a division of application Ser. No. 07/983,799 filed Nov. 24, 1992, U.S. Pat. No. 5,367,483.

BACKGROUND OF THE INVENTION

1. Field of the Invention

The present invention relates to a method for manufacturing electrically erasable and programmable read-only memory cells, technically known as EEPROMs, with a single polysilicon level.

2. Discussion of the Related Art

Voltages between 12 volts and 18 volts are conventionally used in the programming of devices with electrically erasable and programmable read-only memory cells, or EEPROMs; this acronym is used hereinafter for the sake of simplicity.

One of the most severe problems of these devices is the need to control and handle the programming and operation voltages, which have a rather high modulus, inside the device itself. In particular, it should be noted that it is the transistors of the EEPROM cell that must be able to ensure its reliability with regard to the programming and operating voltages.

Furthermore, the punch-through or breakdown voltage of the junctions and the threshold voltages of the parasitic field transistors, which are usually present in semiconductor devices, must be higher than the maximum cell programming voltage, with a certain safety voltage range.

These problems and inconveniences become very important with high- and very high-density technologies, which entail thinner oxide layers with more heavily doped substrates.

A typical EEPROM cell, considered herein, is one with a floating gate terminal, disclosed in U.S. Pat. No. 5,107,461. An EEPROM cell is programmed by means of the electron tunneling effect in the thin oxide region, which region has a thickness of 10 nanometers or less, between the drain terminal of the cell and the floating gate terminal.

Cell writing occurs by connecting the control gate terminal of the cell to ground while the drain terminal of the cell is connected to the above-mentioned high programming voltage by means of an access transistor.

Cell erasure occurs by connecting the drain terminal of the cell to the ground while the gate terminal is connected to the high programming voltage. The electrons flow together from the drain terminal to the floating gate terminal, and the sensing transistor, when at the end of the electron pulse, is in the inactive or "off" state.

In known cells, the floating gate terminal is subjected to the heavy implantation of the source and drain terminals, and this fact causes damage to the thin oxide, due to an electrostatic effect, as mentioned in the article "EFFECTS OF ION IMPLANTATION ON DEEP-SUBMICROMETER, DRAIN-ENGINEERED MOSFET TECHNOLOGIES", by Mark G. Stinson and Carlton M. Osburn, published in IEEE TRANSACTIONS ON ELECTRONIC DEVICES, vol. 38, no. 3, March 1991.

SUMMARY OF THE INVENTION

One aim of the present invention is to substantially eliminate or substantially reduce the problems described above in connection with conventional EEPROM cells. Another aim is to provide a method for producing electrically erasable and programmable read-only memory cells with a single polysilicon level for improving reliability.

Within the scope of these aims, an object of the invention is to provide a method which enables maintaining the breakdown voltage and the threshold voltages of parasitic field transistors above the cell programming voltage.

Another object of the present invention is to provide a method which enables use of high programming voltages which are applied to the gate terminal of the access transistor, operating with smaller electric fields.

A further object of the present invention is to provide a method which improves writing efficiency during cell programming.

An even further object of the present invention is to provide a method which is highly reliable, relatively easy to perform and at competitive costs.

This aim, these objects and others, which will become apparent to those skilled in the art, are achieved by a method for producing electrically erasable and programmable read-only memory cells with single polysilicon level according to the invention which method includes the steps of:

providing an active area on a transistor portion and EEPROM cell portion of a doped silicon substrate; growing a first layer if silicon oxide on the active area of the transistor and EEPROM cell portions; depositing a layer of radiation-sensitive material on the layer of silicon oxide; masking portion of the radiation-sensitive material; removing unmasked portions of the radiation sensitive material, leaving a protective portion of the radiation-sensitive material over the active area of the EEPROM cell portion; etching the first silicon oxide layer on the active area of the transistor portion; removing the protecting portion of the radiation-sensitive material; and growing a second layer of silicon oxide on the active areas of the transistor and EEPROM cell portions, yielding a combined layer of silicon oxide on the EEPROM cell portion.

In another embodiment of the present invention, the method further includes, after the last step, the steps of: doping, through light phosphorus implantation, the active area of the EEPROM cell portion; protecting the active area of the EEPROM cell portion from doping; and doping, through heavy arsenic implantation, the EEPROM cell portion.

Further characteristics and advantages of the invention will become apparent from a reading of the detailed description of a preferred but not exclusive embodiment of a method for producing electrically erasable and programmable read-only memory cells with single polysilicon level according to the invention, illustrated only by way of a non-limiting example in the accompanying drawings.

DETAILED DESCRIPTION OF THE INVENTION

Figure 1A:
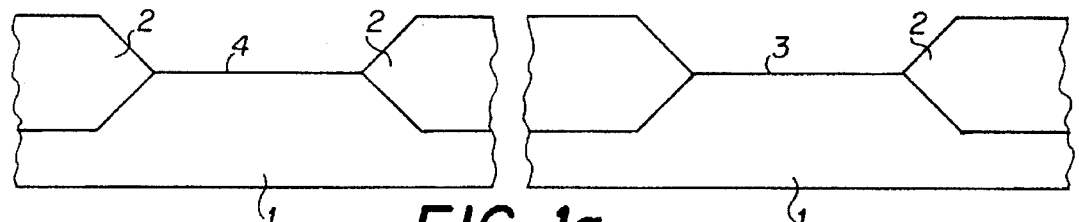
FIGS. 1a to 1f are cross-sectional views of an active area of an electrically erasable and programmable read-only memory cell with a single polysilicon level illustrating the steps of the method of the present invention.
Figure 1B:
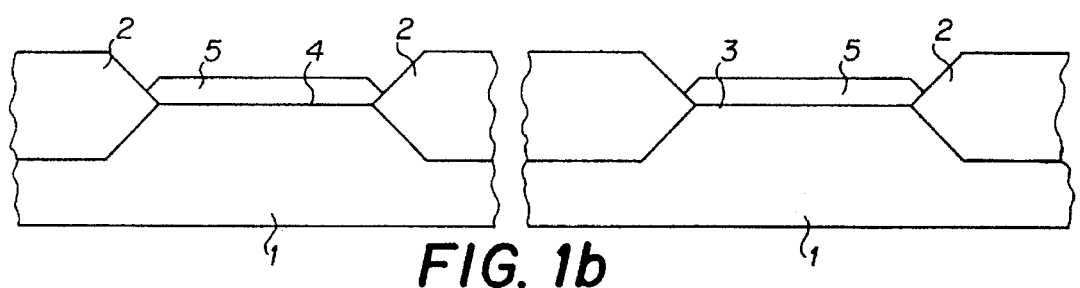
Figure 1C:
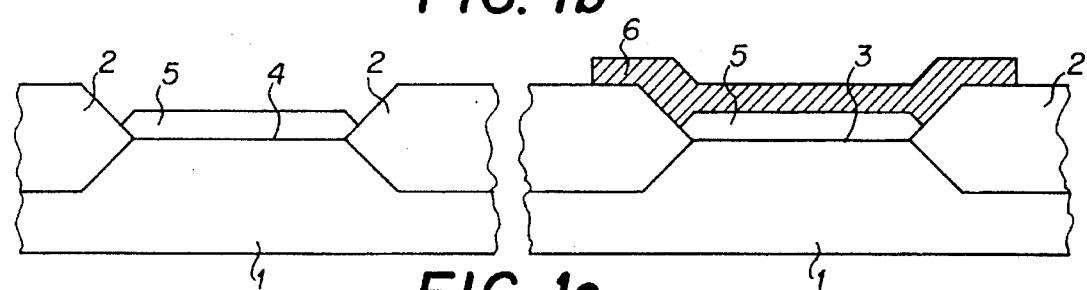
Figure 1D:
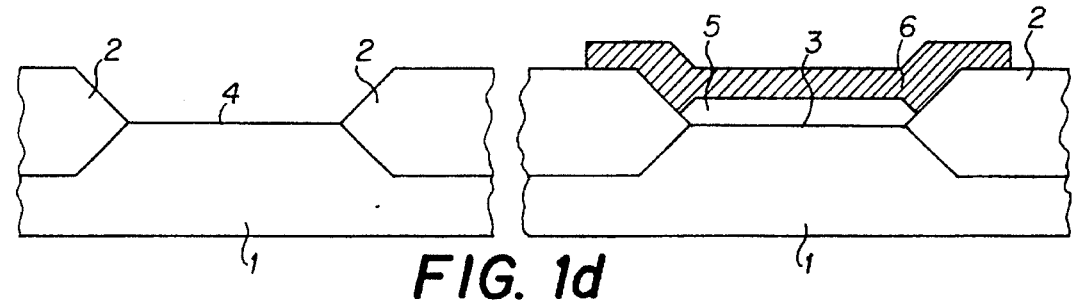
Figure 1E:
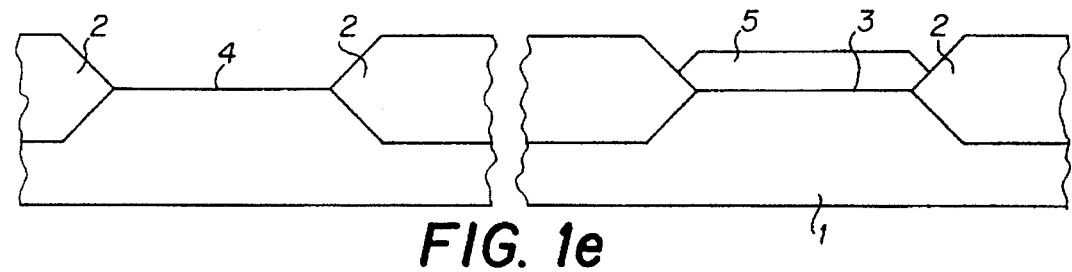
Figure 1F:
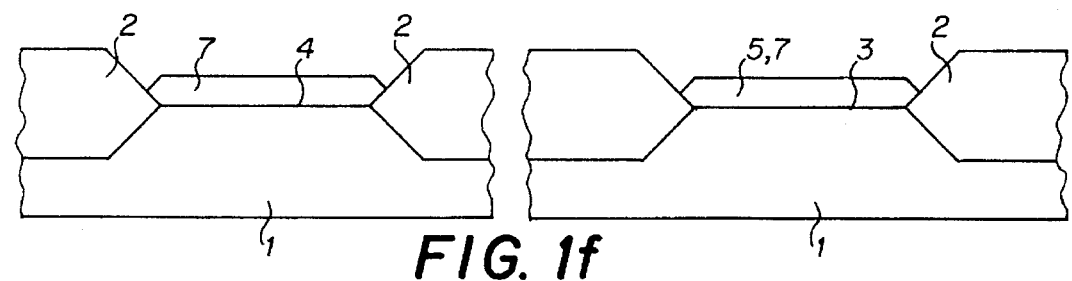

With reference to FIGS. 1a to 1f, a method for producing electrically erasable and programmable read-only memory cells with a single polysilicon level, includes the following steps:

1. A preparation step (FIG. 1a) wherein an active area 3 is provided on the electrically erasable and programmable read-only memory cells and an active area 4 is provided on the transistor circuitry. The active areas 3 and 4 are provided on a doped silicon substrate 1, by growing gate oxide 2;
2. A first oxidation step (FIG. 1b) wherein a layer 5 of silicon oxide is grown on the active areas 3 and 4;
3. A protection step (FIG. 1c) wherein a layer of radiation-sensitive material is deposited on the device and is subsequently masked, the soluble parts thereof being then removed, leaving protective portions 6 of the radiation-sensitive material on the silicon-oxide layer 5;
4. An etching step (FIG. 1d) wherein the silicon oxide 5, on the active area 4, is etched;
5. A cleaning step (FIG. 1e) wherein the protective portions 6 are removed from the remaining portion of silicon oxide layer 5 on the active area 3;
6. A second oxidation step (FIG. 1f) wherein a further silicon oxide layer 7 is grown on the active areas 3 and 4, obtaining, on the active area 3, a combined layer 5, 7 of silicon oxide of greater thickness than the single silicon oxide layer 5.

These steps yield a combined layer 5, 7 of silicon oxide having a thickness between 30 and 35 nanometers, approximately twice the typical thickness of a single silicon oxide layer 7, which typical single layer thickness is between 18 and 22 nanometers.

Through two of the steps of the above-described method, oxide of the gate terminal of the access and sensing transistors, which constitute the active area 3, is thermally grown: the first step, that being the first oxidation step, simultaneously provides for the growth of a sacrificial layer; the second step, that being the second oxidation step, provides for the growth of the oxide of the gate terminal of the transistors of the circuitry. In practice it is necessary to provide an additional mask which protects the silicon oxide layer 5 during the step of etching the sacrificial silicon oxide, which is normally removed before growing the gate terminal oxide of the transistors of the circuitry.

Figure 2:
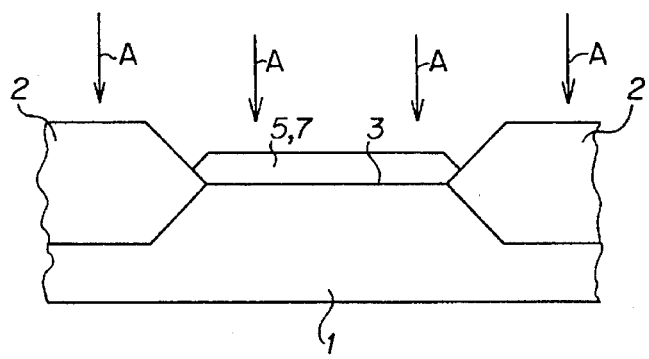
FIG. 2 is a cross-sectional view of a substrate portion of an EEPROM of the present invention with an active area delimited by gate oxide and covered with silicon oxide.
Figure 3:
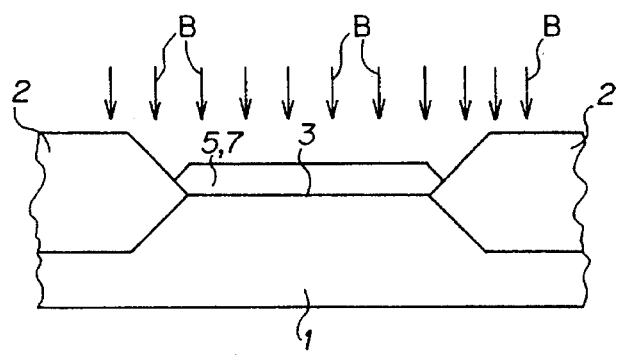
FIG. 3 is a cross-sectional view of a substrate portion of an EEPROM of the present invention with a transistor area of the circuitry.

During the programming of the memory cell, a high voltage is applied to the drain terminal of the access transistor. It is thus necessary to prevent breakdown of the junction the access transistor, which usually has a breakdown voltage which is much lower than that of the simple diffusion of the drain terminal due to the presence of the gate terminal of the transistor (breakdown gated). One breakdown prevention mechanism involves acting on the concentration of the diffusion of the drain terminal of the access transistor so as to considerably increase its junction perforation voltage, For this breakdown prevention purpose, the method according to the invention includes the following additional steps:

7. A first doping step (FIG. 2) wherein a light implantation of phosphorus A is performed on the silicon oxide combined layer 5, 7;
8. A second doping step (FIG. 3) wherein the silicon oxide combined layer 5, 7 is protected from the heavy arsenic implantation B through use of a mask, wherein the silicon oxide combined layer 5, 7 constitutes the source and drain junction of the transistors of the circuitry.

The mask used during the second doping step is designed so as to exclude heavy doping in the cell region. The dose of the light implantation (LDD) determines the value of the breakdown voltage.

The dose of the light phosphorus implantation can vary from approximately $5*10^{12}$ to $5*10^{13}$ atoms/cm$^2$ at an energy substantially within the range of 40 to 80 KeV. With these implantation doses, the breakdown voltage of the junction has been found to be higher than 19 volts.

Figure 4:
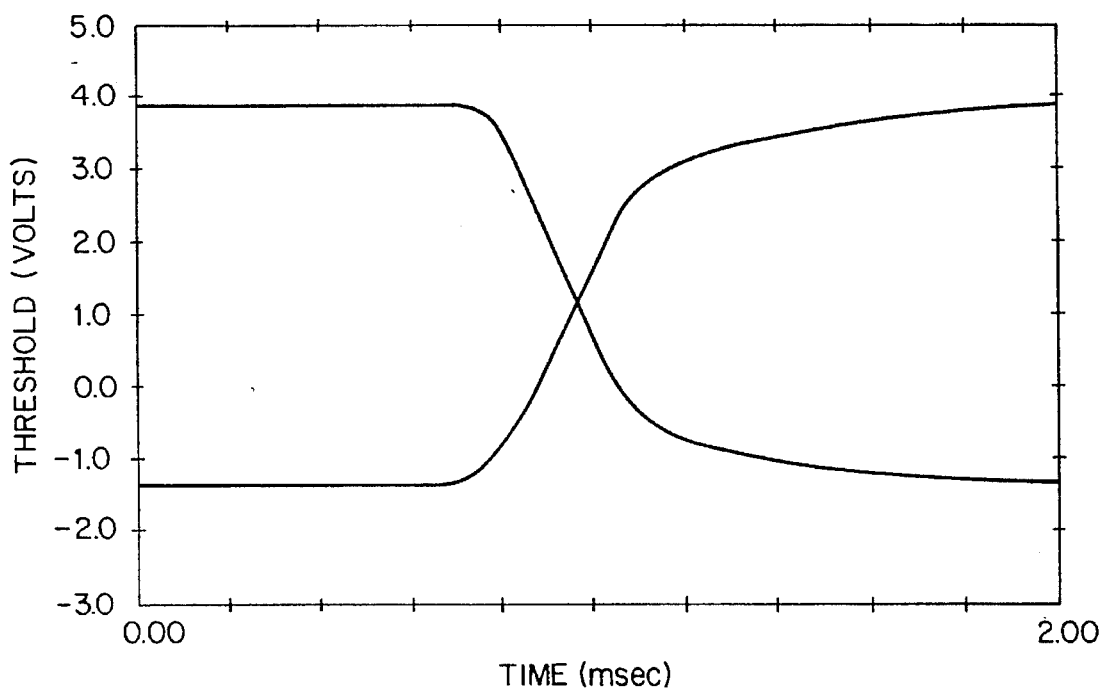
FIG. 4 is a diagram of the read/write characteristics of a cell produced with the method of the present invention.

FIG. 4 illustrates the characteristics of electric erasure and writing of a cell with light doping affecting the entire combined layer 5, 7. The capacitive coupling coefficient, which is better defined hereinafter, is equal to $A_g$=0.7, and the programming pulse used is defined by the following parameters:

pulse amplitude $V_{pp}$=14 volts pulse duration $T_{pp}$=2 milliseconds rise time $T_{up}$=1 millisecond read drain voltage $V_d$=1 volt body voltage=$V_b$=−2.5 volts gate transfer voltage $V_{tg}$=17 volts The electric operating characteristics of the cell produced with the method according to the present invention are substantially better than those of a conventional cell and the produced cell operates with greater reliability, as described below.

Providing the transistors of the memory cell with a thicker gate terminal oxide improves the reliability of the cell itself. A thicker oxide, i.e. a thicker silicon oxide combined layer 5, 7, advantageously enables applying a higher voltage to the gate terminal of the transistor without the danger of breakage of the oxide, while simultaneously operating with electric fields which are smaller than those of conventional cells.

The capacitive coupling coefficients of the drain terminal $A_d$ and of the gate terminal $A_g$ are defined as follows:

$$A_d=(C_d+C_{tun})/C_{tot}$$

$$A_g=C_{pp}/C_{tot}$$

where:

$C_d$=drain capacitance plus the drain capacitance of read transistor $C_{tun}$=tunnel capacitance $C_{pp}$=capacitance of control gate terminal $C_{tot}$=total capacitance of floating gate terminal As is known to those skilled in the art, the capacitive coupling coefficients determine the electric write and erasure efficiency of the cell. The electric write and erasure efficiencies are respectively proportional to $(1-A_d)$ and to $A_g$. It should be appreciated that an increase in the thickness of the oxide of the gate terminal of the active area 3 reduces both the drain capacitance and the drain capacitance of the read transistor, thus facilitating write efficiency.

Advantageously, the breakdown voltage obtained with the method of the present invention has been found to be higher than 1.8 volts and is typically within the range of 18 to 25 volts. The resulting breakdown voltage conveniently allows one to increase the cell programming voltage while shifting its operating limit introduced by the junction breakdown voltage.

The results obtained by the method of the present invention lead to the availability of a degree of freedom which is absent in conventional cells, because the limit to the programming voltage is set exclusively by the threshold voltage of the parasitic field transistor.

Regarding the integrity of the tunnel oxide of the cell, which can be damaged by other implantations, as previously described, this integrity is advantageously preserved by virtue of the protection from the heavy arsenic implantation performed during the second doping step.

Practical tests have shown that the present invention achieves the intended aim and objects, constituting a method for producing electrically erasable and programmable read-only memory cells with a single polysilicon level which are highly reliable and have an increase in the junction breakdown voltage.

The method according to the invention is susceptible to numerous modifications and variations, all of which are within the scope of the inventive concept. All the details may furthermore be replaced with other technically equivalent elements.

In practice, the materials employed, as well as the dimensions, may be any according to the requirements.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. An EEPROM cell comprising:

silicon substrate;

an first active area on the substrate defined by gate oxide regions which contact and lie in substantially the same plane as the first active area;

a second active area on the substrate defining transistor circuitry;

means for providing a cell breakdown voltage which is greater than a cell programming voltage;

wherein the means for providing includes a combined layer of silicon oxide on the first active region and a single layer of silicon oxide on the second active area, the combined layer of silicon oxide, the combined layer having a thickness greater than the single layer.

2. An EEPROM cell as claimed in claim 1 wherein the combined layer of silicon oxide includes two layers of silicon oxide on one another having a total combined layer thickness substantially within the range of 30 to 35 nanometers.

3. An EEPROM cell as claimed in claim 2 wherein the combined silicon oxide layer is lightly doped with phosphorus.

* * * * *